(12) United States Patent
Dakshina-Murthy et al.

(10) Patent No.: US 6,589,858 B1
(45) Date of Patent: Jul. 8, 2003

(54) METHOD OF MAKING METAL GATE STACK WITH ETCH ENDPOINT TRACER LAYER

(75) Inventors: Srikanteswara Dakshina-Murthy, Austin, TX (US); Paul R. Besser, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/163,534

(22) Filed: Jun. 7, 2002

(51) Int. Cl.[7] ......................................... H01L 21/3205
(52) U.S. Cl. ..................... 438/592; 438/9; 438/669; 438/720; 438/740; 438/754; 438/970
(58) Field of Search ........................... 438/9, 592, 669, 438/720, 740, 754, 970, FOR 126

(56) References Cited

U.S. PATENT DOCUMENTS 6,444,513 B1 * 9/2002 Besser et al. ............... 438/216
6,511,911 B1 * 1/2003 Besser et al. ............... 438/656

* cited by examiner

Primary Examiner—George Fourson
Assistant Examiner—Thanh V Pham

(57) ABSTRACT

A metal gate structure and method of making the same provides a tracer layer over a first metal or metal compound layer. When etching a metal gate, formed of tungsten, for example, with a first etchant chemistry optimized for etching tungsten, detection of the tracer layer through optical emission spectroscopy, for example, indicates the imminent clearing of the tungsten. A second etchant chemistry is then employed that is selective to the first metal or metal compound layer, such as TiN, overlying the gate dielectric. This provides a controlled etching of the TiN and thereby prevents degradation of the underlying gate dielectric material.

20 Claims, 7 Drawing Sheets

METHOD OF MAKING METAL GATE STACK WITH ETCH ENDPOINT TRACER LAYER

FIELD OF THE INVENTION

The present invention relates to the field of semiconductor processing, and more particularly to the formation of metal gate electrodes.

BACKGROUND OF THE INVENTION

In the integrated circuit (IC) industry, metal-oxide semiconductor (MOS) transistors have typically been formed utilizing polysilicon gate electrodes. Polysilicon material has been preferred for use as an MOS gate electrode due to its thermal resistive properties (i.e., polysilicon can better withstand subsequent high-temperature processing). Polysilicon's robustness during high-temperature processing allows polysilicon to be annealed at high temperatures along with source and drain regions. Furthermore, polysilicon's ability to block the ion implantation of doped atoms into a channel region is advantageous. Due to the ion implantation blocking potential of polysilicon, polysilicon allows for the easy formation of self-aligned source and drain structures after gate patterning is completed.

However, polysilicon gate electrodes have certain disadvantages. For example, polysilicon gate electrodes are formed from semiconductor materials that suffer from higher resistivities than most metal materials. Therefore, polysilicon gate electrodes may operate at much slower speeds than gates made of metallic materials. To partially compensate for the high resistance, polysilicon materials often require extensive and expensive silicide processing in order to increase their speed of operation to acceptable levels.

Metal gates are therefore being investigated as replacements for polysilicon gates. Metal gates are fabricated in a manner that is similar to the fabrication processes for polysilicon gates. An exemplary layer structure is depicted in FIG. 1A of a metal gate structure. Gate oxide layer 12 is first deposited on a substrate 10. A barrier layer 14, made of titanium nitride (TiN), for example, is formed on the gate oxide layer 12. The layer 14 is primarily chosen for appropriate work function properties, which determine the threshold voltage of the transistor structure. The barrier layer also aids in the adhesion of the subsequently formed metal gate. The TiN can be deposited by conventional methodologies, such as physical vapor deposition (PVD). Alternate materials such as TaN, TaSi$_x$N$_y$, WN etc. may be used for this purpose.

A metal gate layer 16 is then formed on the barrier layer 14. An exemplary material for the metal gate layer 16 is tungsten, although other materials may be used. The tungsten is deposited by conventional methodologies, such as physical vapor deposition.

A Silicon-rich-nitride (SiRN) anti-reflective coating (ARC) 18 is formed on the metal gate layer 16. This is followed by formation of a cap layer 20 over the ARC layer 18. The cap layer 20 may comprise silicon nitride (SiN), for example. The anti-reflective coating 18 and the cap layer 20 aid in the patterning of the gate prior to the reactive ion etch process used to form the gate. Anti-reflective coatings 18, 20 increase the resolution during the lithography process.

After the deposition of the layers 12–20 over the substrate 10, the metal gate is now etched. This is accomplished by conventional patterning and etching techniques. The tungsten layer is typically etched with a fluorine containing chemistry, such as SF$_6$/N$_2$ or SF$_6$/Cl$_2$/N$_2$, with WF$_6$ being the primary product species. The latter chemistry has yielded good profiles. In the latter case, an appropriate SF$_6$/Cl$_2$ ratio may be chosen to provide the best profiles. The recipe may even be richer in Cl$_2$ than in SF$_6$ as required. It is desirable for the etch to have good selectivity to the TiN of the barrier layer 14 so that the tungsten can be cleared across the entire wafer without attacking the gate oxide. Hence, the TiN ideally serves as an etch stop layer during the etching of the tungsten. An ideal etching process is depicted in FIG. 1B, which shows the patterning of the metal gate electrode by an anisotropic reactive ion etch process, stopping on the TiN at the barrier layer 14. However, this depiction is only an ideal depiction, as the TiN has proven in practice to be an inadequate etch stop layer. As depicted in FIG. 1C, when the tungsten is being cleared from the rest of the wafer, the TiN is completely etched on some parts of the wafer (indicated by reference numeral 22 in FIG. 1C) allowing the etchant to attack the gate oxide 12. This occurs because TiN readily etches in the Cl$_2$ containing W etch chemistry. This results in the gate oxide being exposed either to the F from the W chemistry or being subject to the Cl-based TiN chemistry for the course of the TiN etch, both of which result in damage to the gate oxide.

A potential solution is to switch from the chemistry employed to etch W to one that is more suitable for etching TiN with selectivity to oxide, such as Cl$_2$/HBr. This switching of etch chemistry should optimally occur just as the W layer is cleared, so that the etch profiles and the process time are not compromised by switching too early to the TiN etch chemistry. Endpoint monitors, employing optical emission spectroscopy (OES), for example, have been used to detect optical emission from W species to stop the W etch from proceeding once the W film clears, by monitoring the 401 nm W emission line, for example. However, such monitors have not reliably solved this problem, since the thin TiN film continues to etch quickly while the endpoint is being detected, due to etch process and material non-uniformities. Hence, the TiN is often attacked in some regions on the wafer even as the change in the W OES signal is being sensed. Thus, even though a TiN etch selective to gate oxide may be employed when the W endpoint is detected, the attack of TiN during the W etch process itself makes this approach unreliable in practice. Simply increasing the TiN thickness itself is not practical owing to increases in stress leading to possible delamination and/or an increase in sheet resistance. The complete etching away of the TiN leads to degraded gate oxide and decreased yield.

Replacing the TiN with a different etch stop material may detrimentally affect the work function of the TiN, and also may not exhibit the adhesion properties that are desirable in the TiN. However, there is a need for improved structure and methodology that allows the etching of tungsten with a Cl$_2$/SF$_6$/N$_2$ process or other process that properly stops on the etch stop layer and protects the gate oxide across the wafer, without detrimentally affecting the work function of the metal gate, or compromising the etch profiles or the process time.

SUMMARY OF THE INVENTION

These and other needs are met by embodiments of the present invention which provide a method of forming a metal gate on a wafer, comprising the steps of forming a gate dielectric on a substrate, and forming a first metal or metal compound layer, comprising a first metal on the gate dielectric. A first layer of a second metal is formed on the first metal layer, followed by forming a tracer layer of a third metal on the first layer of second metal. A second layer of the second metal is formed on the tracer layer. The second layer of the second metal is then etched with a first etching chemistry, while monitoring the etching until an etching of the tracer layer is detected. The method switches to a second etching chemistry to continue etching until the tracer layer, the first layer of second metal, and the first metal layer are etched.

By employing a tracer layer, the imminent removal of the metal gate layer prior to exposure of the first metal layer, which can be considered an etch stop or barrier layer, is achieved. Hence, a more selective chemistry may be employed to etch the first metal layer with selectivity. This prevents the premature attack of the underlying gate oxide to prevent damage to the gate oxide. In certain embodiments of the invention, the first metal or metal compound is titanium nitride (TiN), the second metal is tungsten (W), and the tracer layer is made of material such at titanium (Ti) or tantalum (Ta). These tracer materials, or other type of tracer materials, have optical emission spectroscopy (OES) emission lines that are sufficiently removed from the OES emission lines of W so as to enable the detection of the clearing of W. Also, the characteristics of metal gates enables the use of metallic tracers, since the sheet resistance, stack stability and ease of deposition are not adversely impacted by introduction of the tracer layer.

In certain embodiments of the invention, the tracer layer is formed directly on the first metal or metal compound layer. For example, a W layer may be formed directly on a TiN layer.

In certain embodiments of the invention, the tracer layer is formed by co-depositing the tracer material as the second metal is deposited. For example, if W is the second metal, a layer of W can be deposited, followed by co-deposition of W and the tracer material, followed again by deposition. This can be achieved by co-sputtering or delta-doping.

The earlier stated needs are also met by embodiments of the present invention that provide a method of etching a metal gate stack on a wafer, the metal gate stack having a first metal layer, a tracer layer over the first metal layer, and a metal gate layer on the tracer layer. The method comprises the steps of etching the metal gate stack with a first etchant chemistry optimized for etching metal gate layer. The method also comprises detecting when the tracer layer has been reached during the etching with the first etching chemistry, and then etching the metal gate stack with a second etching chemistry optimized for etching the first metal layer.

The earlier stated needs are met by still further embodiments of the present invention, which include a metal gate stack comprising a gate dielectric, a first metal layer on the gate dielectric, a tracer layer over the first metal layer, and a metal gate layer on the tracer layer.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of metal gate structures, and particularly, to those involved in the etching of a metal gate causing a possible degradation of gate oxide across a wafer. These and other problems are solved, in part, by the present invention which provides a tracer layer that provides a detectable indication of the imminent removal of the metal gate layer. The inclusion of the tracer layer allows the etching of the cap layer to be performed with an optimal etching chemistry, without fear of overetching into and through the etch stop layer. When the tracer layer is detected, by optical emission spectroscopy (OES), for example, all or substantially all of the metal gate layer has been removed with an etching chemistry that is optimal for process time and profile of the metal gate layer. Once the imminent removal of the cap layer has been determined, the etching chemistry is switched to a second etching chemistry that is more suitable for etching the first metal or metal compound layer, serving as an etch stop layer, such as titanium nitride (TiN) with selectivity to oxide. The switching, just as the metal gate layer is cleared, does not compromise the etch profile and process time by switching too early to the TiN chemistry.

Figure 1A:
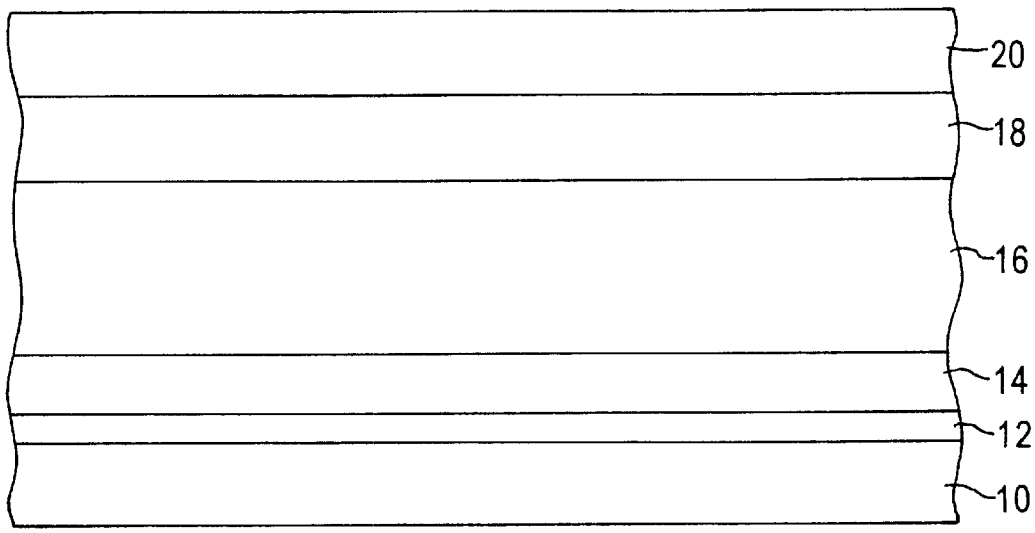
FIG. 1A depicts a metal gate stack prior to the patterning of the metal gate, in accordance with the prior art.
Figure 1B:
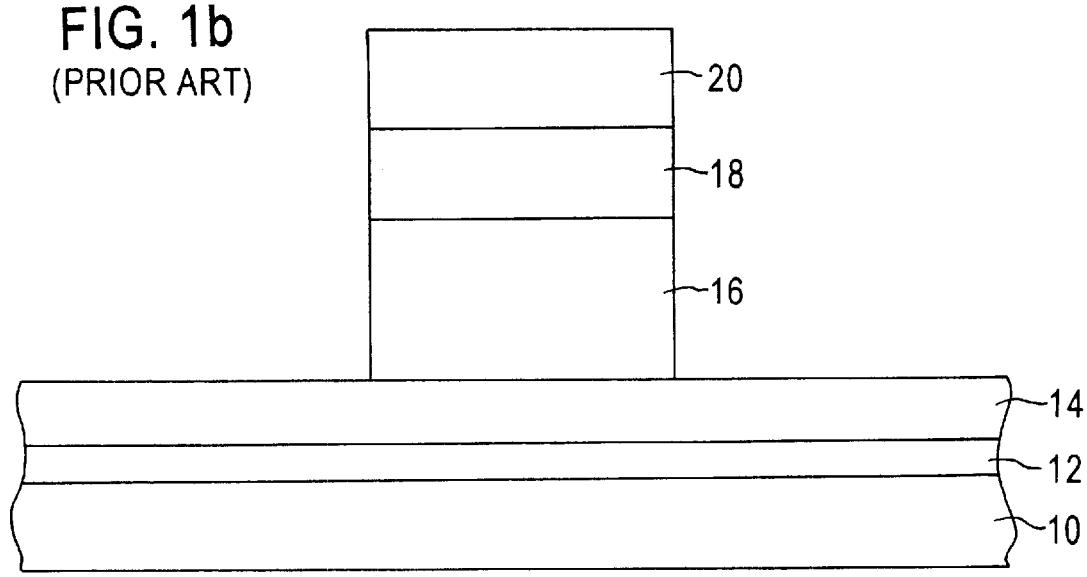
FIG. 1B depicts a metal gate after an ideal etching process in accordance with the prior art.
Figure 1C:
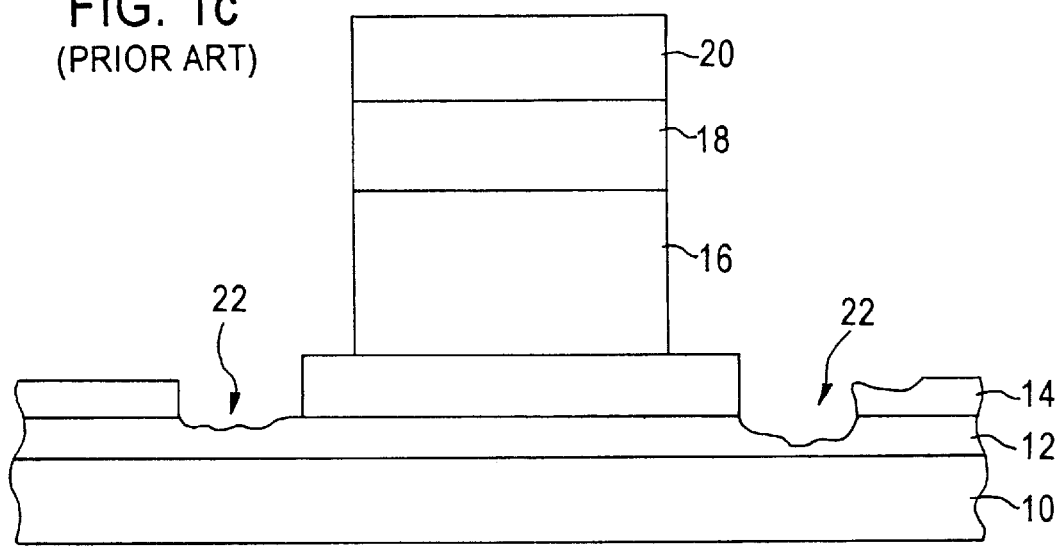
FIG. 1C depicts the metal gate after an actual etching process, exhibiting areas of degraded gate oxide, in accordance with methods of the prior art.
Figure 2:
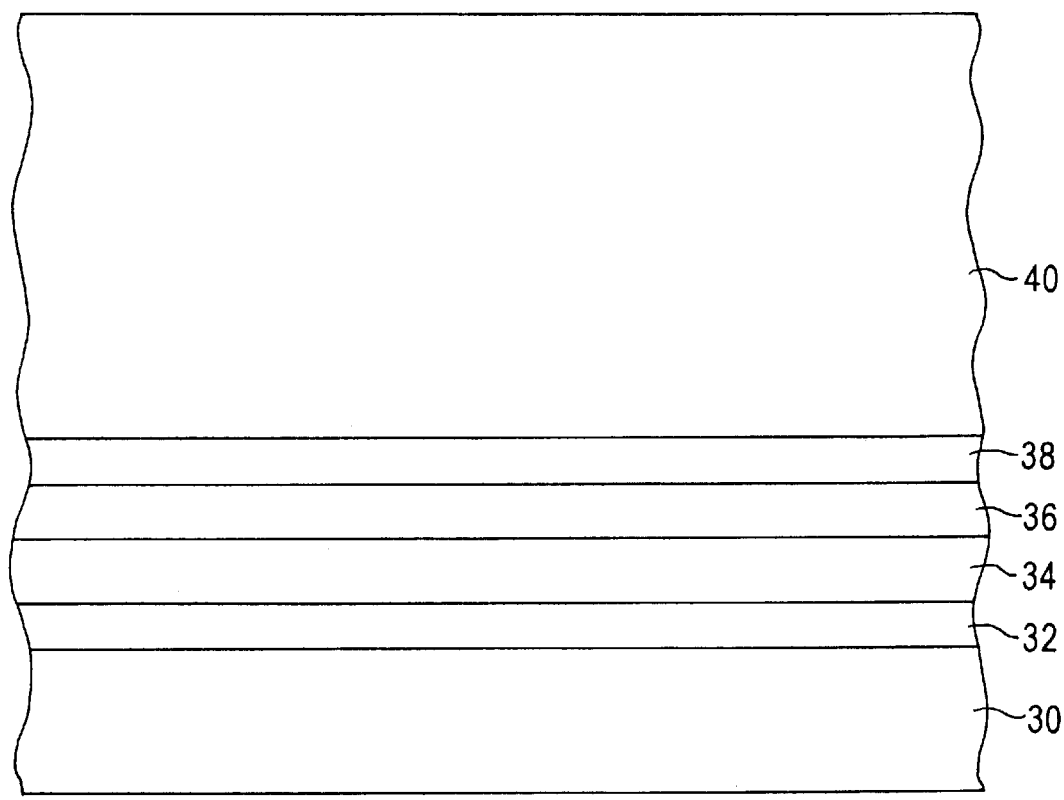
FIG. 2 is a depiction of a cross-section of a portion of a metal gate structure during formation of the metal gate, in accordance with embodiments of the present invention.

FIG. 2 depicts a portion of a metal gate structure during its formation in accordance with certain embodiments of the present invention. Substrate 30 is provided with gate dielectric layer 32 by conventional methodology. The gate dielectric layer 32 may be made of a gate oxide, for example. The gate dielectric layer 32 has a thickness between about 15 Å to about 30 Å in embodiments of the present invention. A first metal or metal compound layer 34 is formed on the gate dielectric layer 32. The first metal layer may comprise TiN, in certain embodiments of the present invention, although other metals may be used. The TiN is deposited by conventional methodologies, such as physical vapor deposition, for example. The thickness of the first metal layer 34 may be between about 100 Å to about 200 Å in certain embodiments of the present invention. The first metal layer 34 may be considered to serve as a barrier layer and an adhesion layer, in certain embodiments. However, the present invention is not limited to these functions for the first metal layer 34, as these functions are exemplary and not limiting. In the prior art, a TiN metal layer served the function of an etch stop layer. It has been found, however, that the TiN is normally inadequate in its function as it fails to protect the underlying gate oxide of a gate dielectric layer 32 across the wafer during the etching of the overlying metal gate layer.

A first layer of a second metal 36 is deposited on the first metal layer 34. The first layer of second metal 36 is formed by tungsten deposited by PVD, for example. The first layer of second metal 36 may be deposited to a thickness of between about 25 Å to about 150 Å, for example, with a preferred thickness of about 100 Å.

A tracer layer 38 is then deposited on the first layer of the second metal 36, by PVD or other suitable deposition method. As exemplary materials, titanium or tantalum may be employed in the tracer layer 38. These materials are considered exemplary only, as other materials may be used with suitable characteristics, as will be described later with respect to the etching process. The thickness of the tracer layer 38 may be between about 25 Å to about 150 Å, with a preferred thickness of about 50 Å, for example. In certain embodiments of the invention, the tracer layer is formed to a thickness of between about 3% to about 10% of the height of the entire metal gate stack.

A second layer of the second metal, such as tungsten, is deposited on the tracer layer 38, and has reference numeral 40. The thickness of the second layer of second metal 40 is between about 200 Å to about 800 Å to form a complete metal gate stack of between about 500 Å to about 1,000 Å.

In other embodiments of the invention, the tracer layer 38 is formed as a co-deposited layer. For example, if tungsten (W) is being deposited by PVD as the first and second layers 36, 40, co-sputtering of titanium (T) or tantalum (Ta) after the formation of the first layer 36 will produce the tracer layer 38. Alternatively, performing the sputtering of tungsten in $N_2$, for a period of time will form WN in the tracer layer 38. Once a certain depth of tracer layer 38 is achieved, pure W deposition is continued again to form second layer 40.

Advantages of inserting the tracer layer 38 as part of the tungsten (or other metal) deposition process include reducing the number of separate deposition steps, thereby reducing costs, in comparison to the earlier described embodiment in which the tracer layer 38 is a separately deposited layer.

Another method of co-depositing includes "delta-doping" with a Ti or Ta precursor during chemical vapor deposition (CVD) of the tungsten. The tracer material can be introduced into the CVD reactor with a carrier gas, such as TDMAT, TDEAT, $TiCl_4$, and $TiBr_4$ for Ti. Other carrier gases can be employed similarly for Ta.

It should be recognized by those of ordinary skill in the art that the thickness ranges given above are exemplary only for each of the layers and the metal gate stack, as other thicknesses for the individual layers and the metal gate stack may be used without departing from the scope of the present invention.

Figure 3:
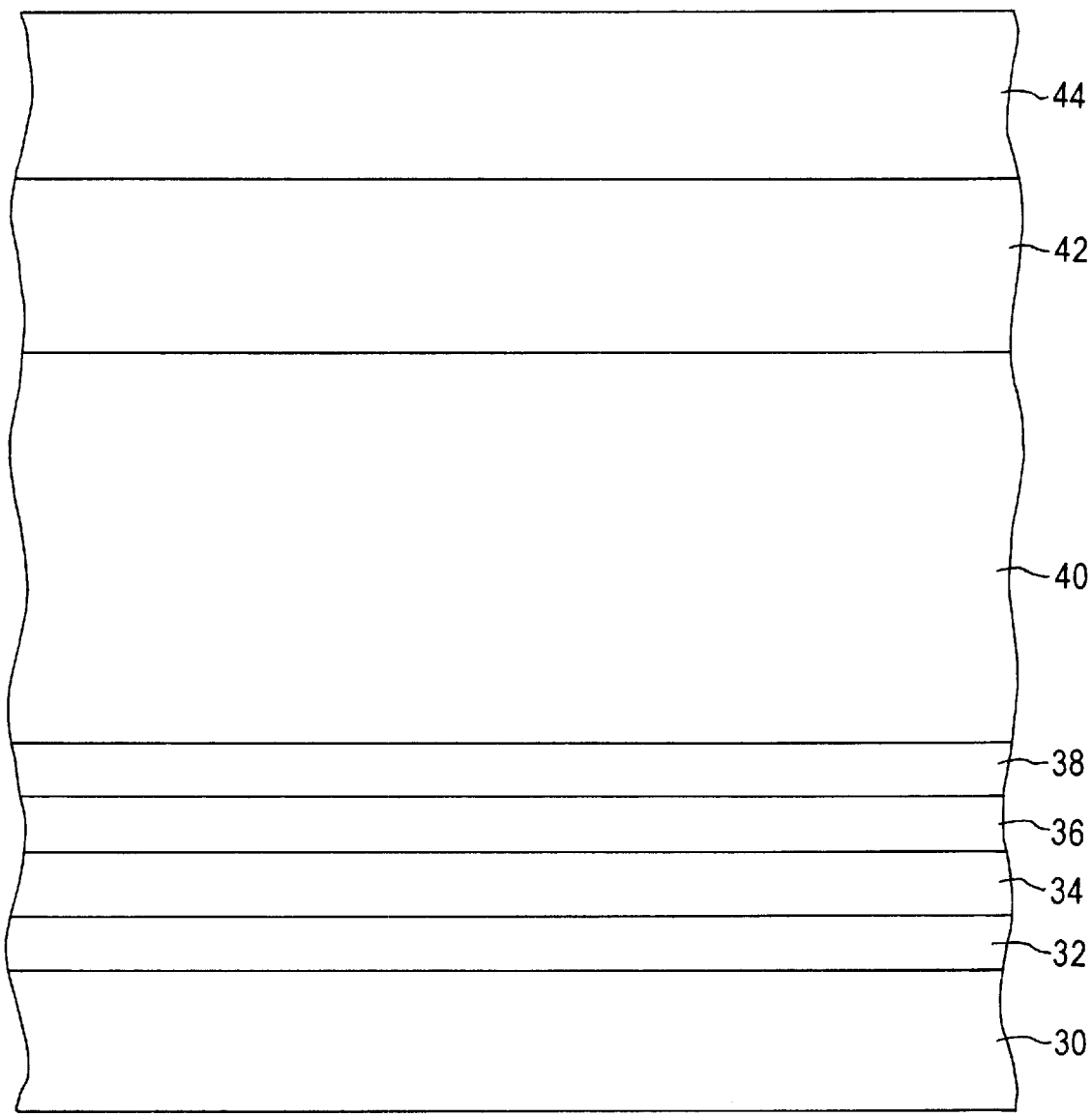
FIG. 3 depicts the structure of FIG. 2, following the deposition of an anti-reflective coating and cap layer, in accordance with embodiments to the present invention.

Anti-reflective coatings, such as an SiRN ARC 42, are provided on the second layer of the second metal 38. A cap layer 44 is then formed over the ARC layer 42. The ARC layer 42 may be between about 300 Å to about 1,000 Å. The cap layer 44, which may be silicon nitride (SiN), for example, may be between about 300 Å to about 1,000 Å. The anti-reflective coating of layer 42 and the cap layer 44 aid in the patterning of the metal gate structure. These coatings are depicted in FIG. 3.

Figure 4:
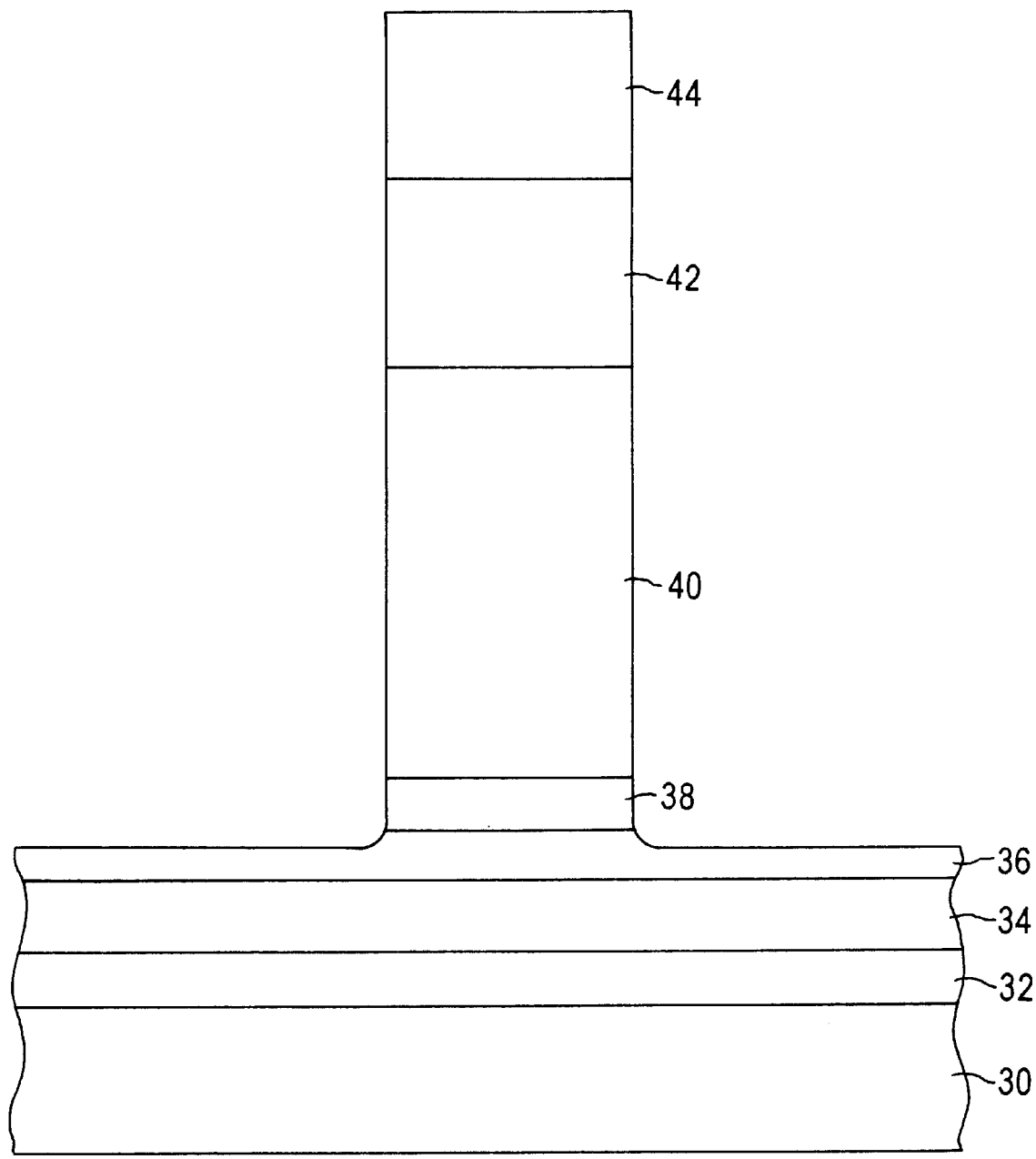
FIG. 4 depicts the metal gate structure after etching has been performed to etch the metal gate with a first etchant chemistry, in accordance with embodiments of the present invention.

Adverting to FIG. 4, following the formation and patterning of a resist mask, the metal gate structure is etched with a first etchant chemistry. The reactive ion etch process, which is an anisotropic etch, is performed. As in conventional methodologies, the etching of the tungsten in the second layer of the metal 38 is preferably performed with a $Cl_2/SF_6/N_2$ process, which currently provides the best tungsten profiles. Such a process, however, has difficulty stopping on a TiN layer, such as the first metal layer 34. The undesirable etch through TiN on some parts of the wafer leads to degraded gate oxides. However, the present invention prevents this from occurring by the use of the tracer layer 38 which aids in the detection of the imminent clearing of the tungsten, such as provided in the first layer of the second metal 36. This detection of the traces layer provides enough time for the etch process to be stopped before the TiN in the first metal layer 34 is attacked by the first etching chemistry.

The detection of the imminent removal of the tungsten layer 36 is signified by detection of an optical emission spectroscopy (OES) emission line of the material forming the tracer layer 38. For example, if titanium is employed as the material on the tracer layer 38, detection of the Ti 335 nm OES emission line or a TiCl 419 nm OES emission line indicates that the etching with the first etchant chemistry has reached the tracer layer 38. Alternatively, in certain embodiments, the imminent removal of the tungsten film may be detected by a change in the W OES emission line (the 401 nm OES emission line) as the tracer layer 38 is etched away in the first etchant chemistry.

Instead of titanium, the material in the tracer layer may be made of tantalum, for example. In such a case, a Ta OES emission line of 265 nm will indicate imminent removal of the tungsten film. From the above, it should be apparent that the choice of tracer material is not unique, but requires that OES emission line of one of its constituents be sufficiently removed from the OES emission line of tungsten so as to enable the detection of tungsten clearing. However, the material employed in the tracer layer 38 should be able to be etched in the same etchant chemistry employed to etch the tungsten in the second layer of the second metal 40.

It should be apparent to those of skill in the art that the choice of material need not be based on OES emission line considerations, as other means of detection of when the tracer layer is reached may be employed in the invention. In such embodiments, the requirements for material choice will be based upon the detection method such that the tracer material etching may be distinctly detected in comparison to the tungsten or other metal gate material.

Although the etch process depicted in FIG. 4 has been depicted as having been stopped after the tracer layer 38 has been etched through to reach the first layer of the second metal 36, it is possible for the etching to be stopped prior to complete etching of the tracer layer 38, or with most or substantially all of the first layer of second metal 36 removed. The invention, however, through the use of the tracer layer 38, allows the first etch process with the first etchant chemistry to be stopped prior to attacking of the TiN in the first metal layer 34.

Figure 5:
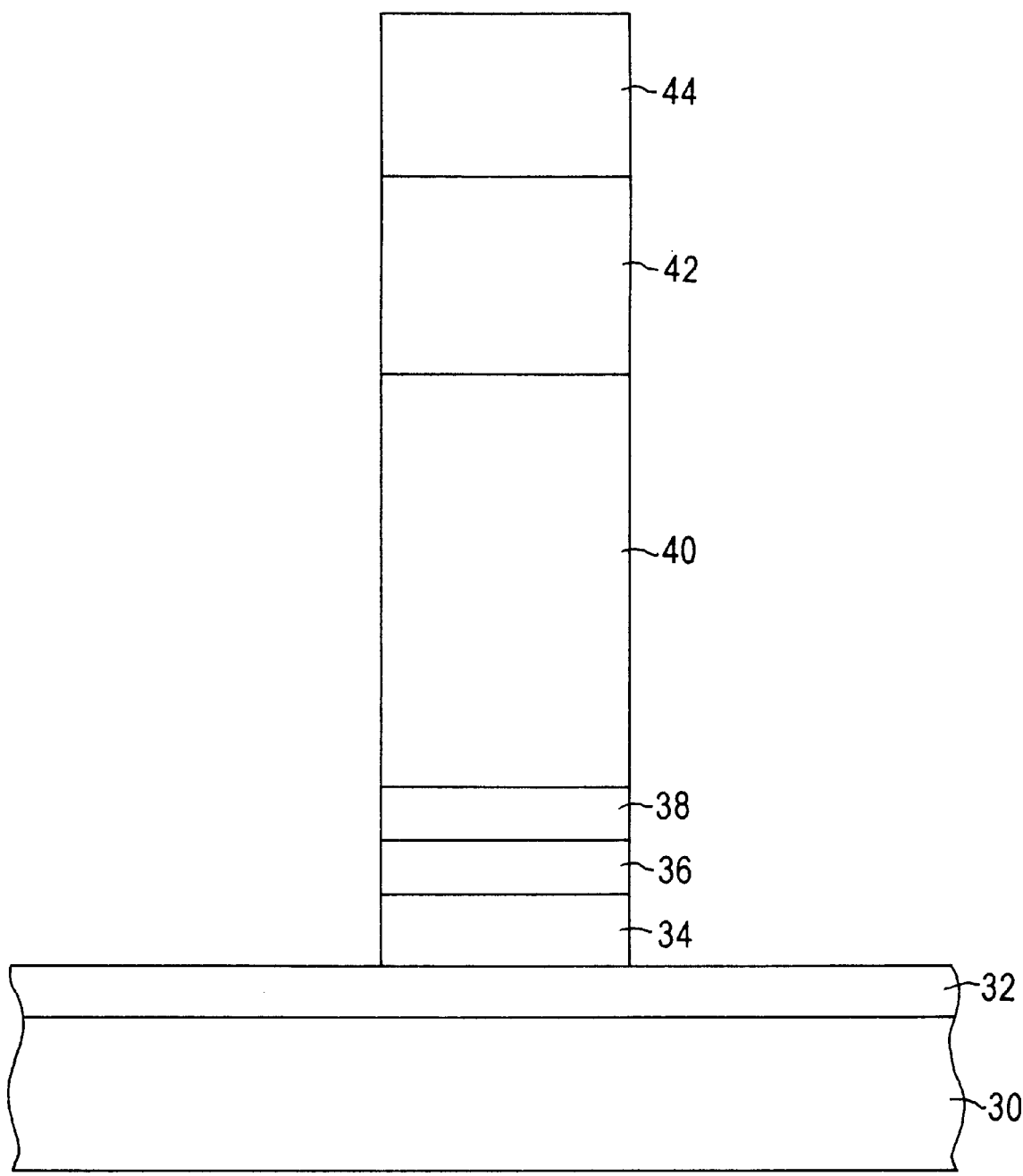
FIG. 5 depicts the metal gate structure of FIG. 4, after switching to a second etching chemistry selective to the first metal layer, in accordance with embodiments of the present invention.

Following detection of the imminent clearing of the tungsten, present in the first layer of the second metal 36, a switch to a second etchant chemistry is now made. The second etchant chemistry is preferably a chemistry that is more suitable for etching the material in the first metal layer 34. For example, for etching TiN with selectivity to oxide, a suitable etchant chemistry is $Cl_2$/HBr. This second etchant chemistry may be slower and not yield as good a profile of tungsten, but since the tungsten has been substantially or completely cleared at this point in the etching process, the switch to a second etchant chemistry that is more suitable for etching the first metal layer 34 does not adversely impact the profile or process time. The etching proceeds with the second etchant chemistry to remove the first metal layer 34, as depicted in FIG. 5. The etching is precisely controlled to prevent degradation of the underlying gate dielectric layer 32.

Figure 6:
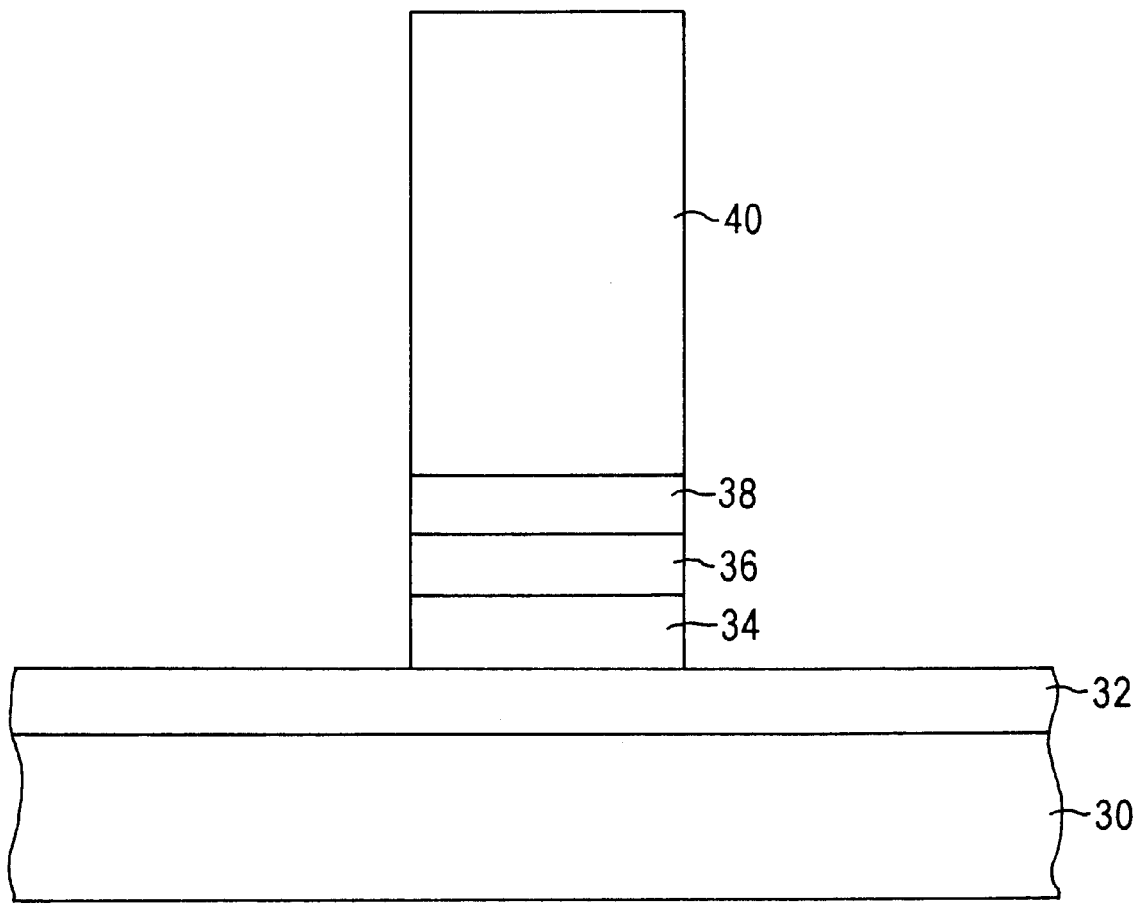
FIG. 6 depicts the metal gate structure of FIG. 5, after the cap layer and the anti-reflective coating have been removed in accordance with embodiments of the present invention.

FIG. 6 depicts the metal gate structure of FIG. 5 after the cap layer 44 and the anti-reflective coating 42 have been removed by conventional etching techniques. This leaves a metal gate structure that has a gate dielectric layer, a first metal layer on the gate dielectric, a tracer layer over the first metal layer, and a metal gate layer on the tracer layer. In the illustrated embodiment, a first layer of the metal gate is provided between the first metal layer and the tracer layer. The tracer layer has a thickness that does not significantly affect the stack height and does not deleteriously affect the work function of the metal gate. Further, the sheet resistance, stack stability and ease of deposition are not adversely impacted by the introduction of the thin tracer layer. The use of the tracer layer enables more controlled etching and optimization of the etchant chemistry while preventing degradation of the underlying gate dielectric material.

Figure 7:
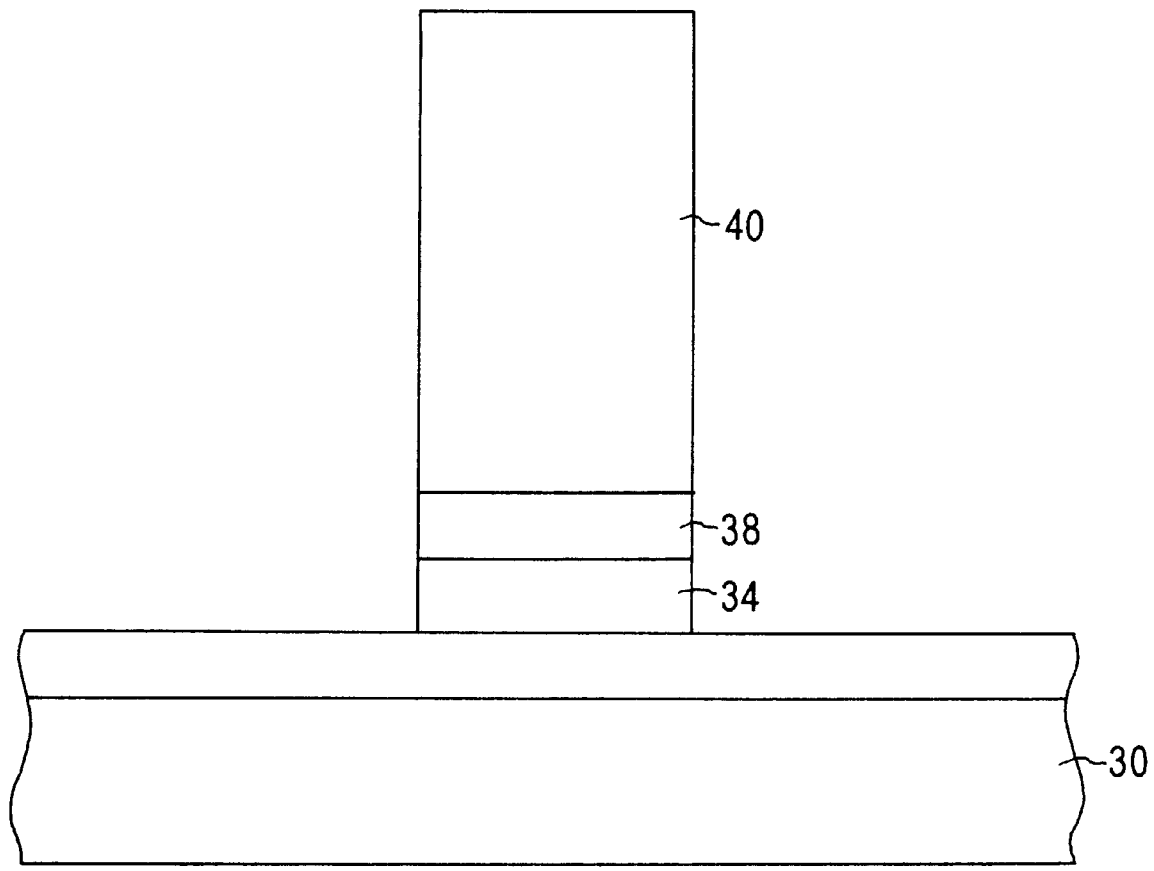
FIG. 7 depicts an alternative embodiment of the present invention.

FIG. 7 depicts a metal gate structure in accordance with the processing steps described above. However, this embodiment differs in that the first metal layer 36 of the second metal is not present. Thus, the tracer layer 38 is formed directly on the first metal or metal compound layer 34 (e.g., TiN). This reduces the robustness of the structure, since it reduces the amount of time prior to reaching the TiN in the first metal layer 34 after detecting the tracer material in the tracer layer 38. Some time is provided, however, so this embodiment also achieves the desired results of improving the gate structure.

Although the present invention has been described and illustrated in detailed, it is to be clearly understood that the same is by way of illustration and example only and is not to be taken by way of limitation, the scope of the present invention being limited only by the terms of the appended claims.

What is claimed is:

1. A method of forming a metal gate on a wafer, comprising the steps of:
   forming a gate dielectric on a substrate;
   forming a first metal or metal compound layer consisting of a first metal on the gate dielectric;
   forming a first layer of a second metal having a different compound than the first metal or metal compound layer on the first metal layer;
   forming a tracer layer of a third metal on the first layer of second metal;
   forming a second layer of the second metal on the tracer layer;
   etching the second layer of the second metal with a first etchant chemistry and monitoring the etching until etching of the tracer layer is detected; and
   switching to a second etchant chemistry to continue etching until the tracer layer, the first layer of second metal, and the first metal or metal compound layer are etched.

2. The method of claim 1, wherein the first metal or metal compound is TiN.

3. The method of claim 1, wherein the second metal is W.

4. The method of claim 1, wherein the third metal is Ti.

5. The method of claim 1, wherein the third metal is Ta.

6. The method of claim 1, wherein the first metal or metal compound is TiN, the second metal is W, and the third metal is one of Ti or Ta.

7. The method of claim 6, wherein the first etchant chemistry is a chemistry optimal for etching W, and the second etchant chemistry is a chemistry optimal for TiN.

8. The method of claim 7, wherein the first etchant chemistry includes $Cl_2/SF_6/N_2$, and the second etchant chemistry includes $Cl_2/HBr$.

9. The method of claim 1, wherein the second metal has a set of optical emission spectroscopy (OES) emission lines, and the third metal has a set of OES emission lines, with at least one of the third metal OES emission lines separated from the second metal OES emission lines by a detectable amount.

10. The method of claim 1, wherein the step of monitoring the etching includes detecting an optical emission spectroscopy (OES) emission line of the third metal.

11. The method of claim 1, wherein the step of monitoring the etching includes monitoring the optical emission spectroscopy (OES) emission line of the second metal and detecting a change in the OES emission line of the second metal, thereby indicating etching of the tracer layer.

12. The method of claim 1, wherein the first layer of the second metal is between about 25 Å to about 150 Å.

13. The method of claim 12, wherein the tracer layer is formed to a thickness between about 25 Å to about 150 Å.

14. The method of claim 13, wherein the first layer of the second metal is formed to a thickness of about 100 Å, and the tracer layer is formed to a thickness of about 50 Å.

15. The method of claim 1, wherein the step of forming a tracer layer includes co-depositing a tracer material with the second metal.

16. The method of claim 15, wherein the step of co-depositing includes co-sputtering the tracer material with the second metal by physical vapor deposition.

17. The method of claim 16, wherein the tracer material is one of Ti or Ta, and the second metal is W.

18. The method of claim 15, wherein the step of co-depositing includes introducing $N_2$ during depositing of the second metal by physical vapor deposition.

19. The method of claim 15, wherein the step of co-depositing includes delta-doping with a tracer material precursor during depositing of the second metal by chemical vapor deposition (CVD).

20. The method of claim 16, wherein a precursor of the tracer material is a Ti or a Ta precursor, and the second metal is W.

* * * * *